US009559167B2

(12) United States Patent
Zundel et al.

(10) Patent No.: US 9,559,167 B2
(45) Date of Patent: Jan. 31, 2017

(54) SEMICONDUCTOR COMPONENT WITH DYNAMIC BEHAVIOR

(71) Applicant: Infineon Technologies AG, Neubiberg (DE)

(72) Inventors: Markus Zundel, Egmating (DE); Franz Hirler, Isen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/004,467

(22) Filed: Jan. 22, 2016

(65) Prior Publication Data

US 2016/0141410 A1    May 19, 2016

Related U.S. Application Data

(63) Continuation of application No. 14/514,491, filed on Oct. 15, 2014, now Pat. No. 9,257,512, which is a (Continued)

(30) Foreign Application Priority Data

Aug. 10, 2007 (DE) .................. 10 2007 037 858

(51) Int. Cl.
*H01L 29/08* (2006.01)
*H01L 29/40* (2006.01)
(Continued)

(52) U.S. Cl.
CPC ....... *H01L 29/0878* (2013.01); *H01L 29/1045* (2013.01); *H01L 29/1095* (2013.01);
(Continued)

(58) Field of Classification Search
CPC .. H01L 29/407; H01L 29/404; H01L 29/0878; H01L 29/42368
See application file for complete search history.

(56) References Cited

U.S. PATENT DOCUMENTS 4,941,026 A    7/1990 Temple
5,637,898 A    6/1997 Baliga
(Continued)

FOREIGN PATENT DOCUMENTS

DE    19925880 A1    12/2000
DE    10207309 A1    9/2003
(Continued)

OTHER PUBLICATIONS

Dobkin, Daniel M. "Silicon Dioxide: Properties and Applications", http://timedomaincvd.com/CVD_Fundametnals/films/SiO2_properties.html, Apr. 27, 2007.

*Primary Examiner* — Joseph C Nicely
(74) *Attorney, Agent, or Firm* — Dicke, Billig & Czaja, PLLC

(57) ABSTRACT

One embodiment provides a semiconductor component including a semiconductor body having a first side and a second side and a drift zone; a first semiconductor zone doped complementarily to the drift zone and adjacent to the drift zone in a direction of the first side; a second semiconductor zone of the same conduction type as the drift zone adjacent to the drift zone in a direction of the second side; at least two trenches arranged in the semiconductor body and extending into the semiconductor body and arranged at a distance from one another; and a field electrode arranged in the at least two trenches adjacent to the drift zone. The at least two trenches are arranged at a distance from the second semiconductor zone in the vertical direction, a distance between the trenches and the second semiconductor zone is greater than 1.5 times the mutual distance between the trenches, and a doping concentration of the drift zone in a section between the trenches and the second semiconductor zone differs by at most 35% from a minimum doping concentration in a section between the trenches.

20 Claims, 6 Drawing Sheets

Related U.S. Application Data continuation of application No. 12/186,034, filed on Aug. 5, 2008, now Pat. No. 9,202,881.

(51) Int. Cl.

| | | |
|---|---|---|
| *H01L 29/423* | (2006.01) | |
| *H01L 29/739* | (2006.01) | |
| *H01L 29/78* | (2006.01) | |
| *H01L 29/861* | (2006.01) | |
| *H01L 29/10* | (2006.01) | |
| *H01L 29/66* | (2006.01) | |

(52) U.S. Cl.
 CPC .......... *H01L 29/404* (2013.01); *H01L 29/407* (2013.01); *H01L 29/4236* (2013.01); *H01L 29/42368* (2013.01); *H01L 29/66734* (2013.01); *H01L 29/7397* (2013.01); *H01L 29/7802* (2013.01); *H01L 29/7809* (2013.01); *H01L 29/7813* (2013.01); *H01L 29/7827* (2013.01); *H01L 29/861* (2013.01)

(56) References Cited

U.S. PATENT DOCUMENTS

| | | | |
|---|---|---|---|
| 5,998,833 | A | 12/1999 | Baliga |
| 6,130,154 | A | 10/2000 | Yokoyama et al. |
| 6,359,306 | B1 | 3/2002 | Ninomiya |
| 6,566,244 | B1 | 5/2003 | May et al. |
| 6,660,591 | B2 | 12/2003 | Peake et al. |
| 6,806,533 | B2 | 10/2004 | Henninger et al. |
| 6,891,224 | B2 | 5/2005 | Ogura et al. |
| 6,979,621 | B2 | 12/2005 | Hshieh et al. |
| 7,498,520 | B2 | 3/2009 | Osaka et al. |
| 7,531,871 | B2 | 5/2009 | Omura et al. |
| 9,202,881 | B2 * | 12/2015 | Zundel ................ H01L 29/0878 |
| 9,257,512 | B2 * | 2/2016 | Zundel ................ H01L 29/0878 |
| 2002/0100934 | A1 | 8/2002 | Nakagawa et al. |
| 2002/0100984 | A1 | 8/2002 | Oshima et al. |
| 2003/0173618 | A1 | 9/2003 | Zundel et al. |
| 2004/0113202 | A1 | 6/2004 | Kocon et al. |
| 2005/0082591 | A1 | 4/2005 | Hirler et al. |
| 2005/0110149 | A1 | 5/2005 | Osaka et al. |
| 2005/0151190 | A1 | 7/2005 | Kotek et al. |
| 2006/0006386 | A1 * | 1/2006 | Hirler .................... H01L 29/404 257/60 |
| 2006/0017056 | A1 | 1/2006 | Hirler |
| 2006/0020068 | A1 | 1/2006 | Elce et al. |
| 2006/0049454 | A1 | 3/2006 | Thapar |
| 2006/0118864 | A1 | 6/2006 | Hirler et al. |
| 2006/0211179 | A1 | 9/2006 | Siemieniec et al. |
| 2007/0059887 | A1 | 3/2007 | Poelzl et al. |
| 2007/0069257 | A1 | 3/2007 | Mauder et al. |
| 2007/0080395 | A1 | 4/2007 | Wahl et al. |
| 2007/0114600 | A1 | 5/2007 | Hirler et al. |
| 2007/0138544 | A1 | 6/2007 | Hirler et al. |
| 2007/0148947 | A1 | 6/2007 | Davies |
| 2007/0272953 | A1 | 11/2007 | Hirler |
| 2008/0042172 | A1 | 2/2008 | Hirler et al. |
| 2008/0149963 | A1 | 6/2008 | Adan |
| 2008/0179672 | A1 | 7/2008 | Hirler et al. |
| 2008/0188679 | A1 | 8/2008 | Mayorga et al. |
| 2008/0230833 | A1 | 9/2008 | Zundel et al. |
| 2008/0233733 | A1 | 9/2008 | Lin |
| 2009/0072304 | A1 | 3/2009 | Adan |

FOREIGN PATENT DOCUMENTS

| | | |
|---|---|---|
| DE | 102004052678 B3 | 6/2006 |
| DE | 102005008020 A1 | 8/2006 |
| DE | 102005014743 A1 | 10/2006 |
| DE | 102006020870 A1 | 11/2007 |
| EP | 1168455 A2 | 1/2002 |
| WO | 2006/132269 A1 | 12/2006 |
| WO | 2007/015500 A1 | 2/2007 |

\* cited by examiner

SEMICONDUCTOR COMPONENT WITH DYNAMIC BEHAVIOR

CROSS-REFERENCE TO RELATED APPLICATIONS

This Utility Patent Application is a continuation application of U.S. Ser. No. 14/514,491, filed Oct. 15, 2014, which is a continuation application of U.S. Ser. No. 12/186,034 filed Aug. 5, 2008, now U.S. Pat. No. 9,202,881 and claims priority to German Patent Application No. DE 10 2007 037 858.2 filed on Aug. 10, 2007, which is incorporated herein by reference.

BACKGROUND

The present invention relates to a semiconductor component, in particular a transistor, such as a trench transistor, for example.

A trench transistor has a gate electrode arranged in at least one trench of a semiconductor body and serving for controlling a conducting channel in a body zone arranged between a source zone doped complementarily to the body zone and a drift zone doped complementarily to the body zone. The drift zone is arranged between the source zone and a drain zone, wherein the doping and the dimensions of the drift zone crucially determine the dielectric strength of the component.

In order to increase the dielectric strength a field electrode may be provided in the trench of the gate electrode, the field electrode being arranged adjacent to the drift zone and being at gate potential. When the component is turned off, the field electrode serves for compensation of part of the dopant charge present in the drift zone. In the known component, a plurality of trenches having gate electrode sections and field electrode sections arranged therein are present and arranged at a distance from the drain zone. In this case, a distance between the trench and the drain zone is intended to be approximately half as large as a mutual distance between two adjacent trenches.

In "dense trench" transistors gate electrode sections and field electrode sections are spaced apart so closely that during static operation, when a reverse voltage is applied, a field strength maximum occurs at a lower end of the trenches in the drift zone, such that an avalanche breakdown occurs in this region when the dielectric strength limit is exceeded. Transistors of this type are also referred to as "dense trench" transistors.

A further example of a trench transistor is described in DE 10 2004 052 678 B3.

In components of this type, a distinction can be made between two breakdown regimes: the static breakdown explained above, in which only a current having a low current density flows after the breakdown and which is referred to hereinafter as breakdown with low current density; and a breakdown with high current density, in which a high current density is established rapidly in a drift zone section arranged between the trenches. In the case of such a breakdown with high current density, in dense trench transistors the field strength maximum may no longer occur at the lower end of the trenches, but rather at a pn junction between the body zone and the drift zone. This is unfavorable because the entire avalanche current flowing through the component is concentrated on the mesa region between two trenches in which the avalanche breakdown first commences. This can lead to local damage to the component, whereby the component becomes unusable. During an avalanche breakdown that occurs below the trenches in the drift zone, by contrast, the avalanche current is distributed between a plurality of mesa regions, which reduces the risk of destruction.

SUMMARY

A semiconductor component in accordance with one example includes: a semiconductor body having a first side and a second side; a drift zone, a first semiconductor zone, which is doped complementarily to the drift zone and which is adjacent to the drift zone in a direction of the first side, and a second semiconductor zone of the same conduction type as the drift zone, which is adjacent to the drift zone in a direction of the second side; at least two trenches which are arranged in the semiconductor body and which extend into the semiconductor body proceeding from the first side in a vertical direction into the drift zone and which are arranged at a distance from one another in a lateral direction of the semiconductor body; and a field electrode, which is arranged in the at least two trenches adjacent to the drift zone. The at least two trenches are arranged at a distance from the second semiconductor zone in the vertical direction, wherein a distance between the trenches and the second semiconductor zone is greater than 1.5 times the mutual distance between the trenches, and wherein a minimum doping concentration of the drift zone in a section between the trenches differs by at most 35% from a doping concentration of the drift zone in a section between the trenches and the second semiconductor zone.

In this component, the distance between the trenches and the second semiconductor zone enables a space charge zone that occurs during an avalanche breakdown with high current densities to propagate further in a direction of the second semiconductor zone proceeding from the trenches. This results in a reduction of the field strength in a mesa region that is arranged between the trenches, such that a voltage breakdown within the mesa region commences only at higher reverse voltages in comparison with components having a smaller distance between the trenches and the second semiconductor zone. In one embodiment, a negative-differential profile of a current-voltage characteristic curve or breakdown characteristic curve of the component or a snapback behavior is avoided. Such a negative-differential profile of the characteristic curve is present when, in the event of a breakdown, each of the voltage present at the component and the current flowing through the component initially increase but the voltage after a current threshold value has been reached, decreases again as the current increases further. This is referred to as a "snapback" of the characteristic curve profile, which should be avoided.

In a further example the at least two trenches are arranged at a distance from the drain zone in the vertical direction, and a distance between the trenches and the second semiconductor zone and a doping concentration of the drift zone in the section between the trenches and the second semiconductor zone are coordinated with one another in such a way that an integral of the dopant charge of the drift zone in a vertical direction of the semiconductor body in the section between the trenches and the second semiconductor zone is greater than or equal to 1.5 times the breakdown charge of the semiconductor material of the drift zone.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
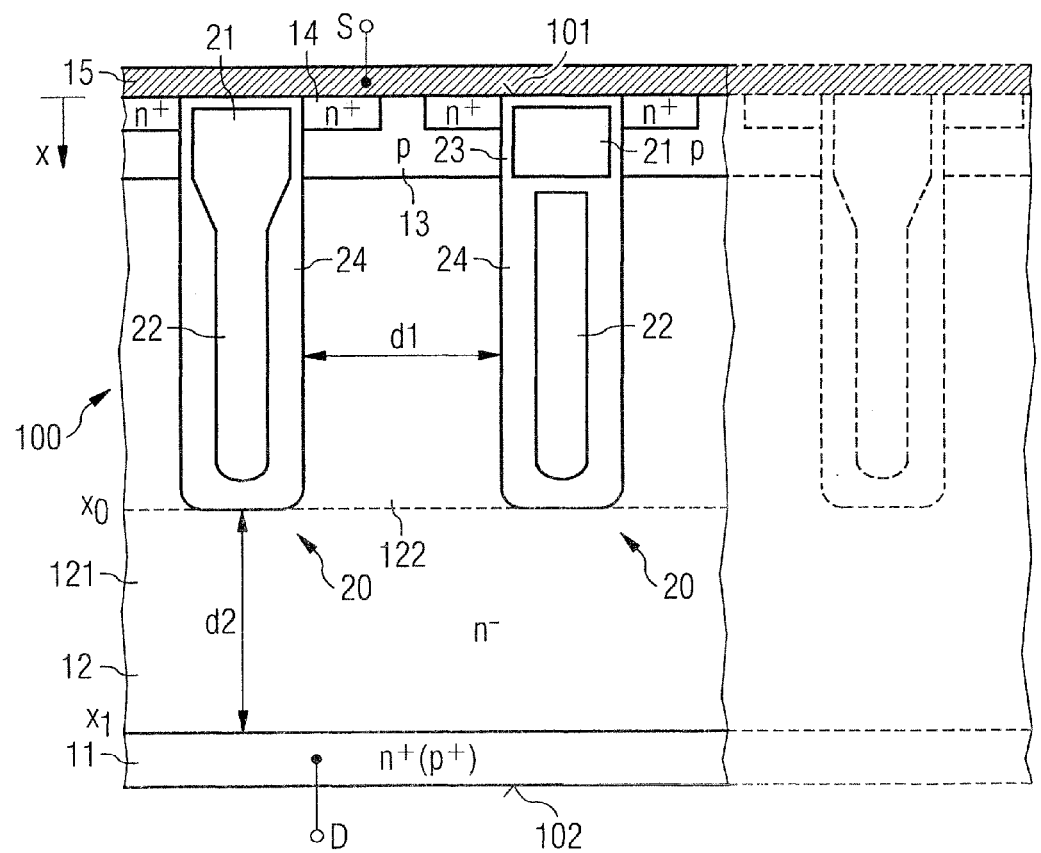
FIG. 1 illustrates one embodiment of a trench transistor.

FIG. 1 illustrates a cross section through a semiconductor component formed as a trench transistor. This trench transistor includes a semiconductor body 100 having a first side 101, which is referred to hereinafter as front side, and having a second side 102 opposite the first side 101, the second side being referred to hereinafter as rear side. Proceeding from the front side 101, the trench transistor has a sequence of differently doped semiconductor zones: a source zone 14; a body zone 13, which is adjacent to the source zone 14 and doped complementarily to the source zone 14; a drift zone 12, which is adjacent to the body zone 13 and doped complementarily to the body zone 13; and a drain zone 11 adjacent to the drift zone 12. The body zone 13 forms a first semiconductor zone doped complementarily to the drift zone 12 and is adjacent to the drift zone 12 in a direction of the front size 101, and the drain zone 11 forms a second semiconductor zone of the same conduction type as the drift zone 12 and is adjacent to the drift zone 12 in a direction of the second side 102. In the example, the drain zone 11 forms the rear side 102 of the semiconductor body. In the case of a trench transistor formed as a MOSFET, the drain zone 11 is of the same conduction type as the drift zone 12 and, in the case of a trench transistor formed as an IGBT, is doped complementarily to the drift zone 12. In the case of an IGBT, a field stop zone (not illustrated) that is doped more highly than the drift zone 12 and is of the same conduction type as the drift zone 12 can be provided within the drift zone 12 or between the drift zone 12 and the drain zone 11.

The doping types of the individual component zones that are specified in FIG. 1 apply to an n-channel MOSFET in which the source zone 14, the drift zone 12 and the drain zone 11 are n-doped and the body zone is p-doped. It should be pointed out in this connection that the teaching of this disclosure is of course not restricted to n-channel MOSFETs, but rather is applicable to any trench transistors, in one embodiment also to p-channel MOSFETs. In a p-channel MOSFET, the doping types of the individual component zones are in each case complementary to the doping types specified in FIG. 1.

The semiconductor body 100 may include a plurality of semiconductor layers, for example, a semiconductor substrate and an epitaxial layer applied to the semiconductor substrate. In this case, the semiconductor substrate forms the drain zone 11, while the remaining component zones are formed in the epitaxial layer applied to the substrate. In this case, the dimensions of the substrate in a vertical direction of the semiconductor body can be significantly larger than the dimensions of the epitaxial layer, though this is not illustrated explicitly in FIG. 1.

In order to control a conducting channel in the body zone 13 between the source zone 14 and the drift zone 12, the trench transistor has a gate electrode 21 having a plurality of gate electrode sections. In this case, the individual gate electrode sections are arranged in trenches 20 extending right into the drift zone 12 proceeding from the front side 101 in a vertical direction of the semiconductor body. The excerpt illustrated in FIG. 1 illustrates two of such trenches 20 which are arranged adjacent to one another in a lateral direction of the semiconductor body 100 and each have a gate electrode section 21. It goes without saying that the component can have a multiplicity of such trenches having gate electrode sections arranged therein, as is indicated by dashed lines in FIG. 1. In the component illustrated, each of the gate electrode sections is part of a transistor cell, of which there are a multiplicity constructed identically and these are connected in parallel. In a plane running perpendicular to the plane of the drawing illustrated, the gate electrode or the gate electrode sections is or are formed, for example, in strip-shaped or lattice-shaped fashion, e.g., with a rectangular, in one embodiment square, or hexagonal grid.

The individual gate electrode sections 21 are in each case dielectrically insulated from the body zone 13 by gate dielectric layers 23. This gate dielectric layer 23 can be composed of a semiconductor oxide, such as silicon oxide, for example.

The component additionally has a field electrode 22, wherein individual field electrode sections are arranged in the same trenches 20 as the gate electrode sections 21 in the example in accordance with FIG. 1. In the example illustrated these field electrode sections 22 are arranged below the gate electrode sections 21 proceeding from the front side 101 in a vertical direction of the semiconductor body 100, and adjacent to the drift zone 12. In this case, the individual field electrode sections 22 are dielectrically insulated from the drift zone 12 by field dielectric layers 24. The field dielectric layer 24 can be composed of a semiconductor oxide, for example, silicon oxide, and can in one embodiment be composed of the same material as the gate dielectric layer 23. However, the gate dielectric layer 23 and the field plate dielectric layer 24 can also be composed of different materials, in one embodiment materials having different dielectric constants. The field dielectric layer 24 can in one embodiment be thicker than the gate dielectric layer 22, whereby a higher voltage loading capacity of the field dielectric layer 24 is achieved, which is subjected to a higher voltage loading than the gate dielectric layer 23 when the component is turned off.

The field electrode 22 is, for example, electrically conductively connected to the gate electrode 21 and is thus at gate potential during operation of the component. For this purpose, a gate electrode section 21 and a field electrode section 22 which are arranged jointly in a trench can be realized integrally or as a common electrode, as is illustrated for a transistor cell in the left-hand part of FIG. 1. However, the field electrode sections 22 can also be realized in a manner insulated from the gate electrode sections 21 and, for example, be connected to the source zone 14 or a source electrode 15 that jointly makes contact with the source zone 14 and the body zone 13. The field electrode 22 is then at source potential during operation of the component. This is illustrated for a transistor cell in the right-hand part of FIG. 1. It should be pointed out that different structures of individual cells are illustrated only for elucidation purposes in FIG. 1. A component usually contains only in each case one of the variants explained, that is to say field electrodes connected either to the source electrode or to the gate electrode.

The functioning of the trench transistor illustrated is explained below: the component illustrated is turned on upon application of an electrical voltage between the drain zone 11 and the source zone 14 and application of an electrical potential suitable for forming an inversion channel in the body zone 13 to the gate electrode 21. In the case of the n-channel MOSFET illustrated in FIG. 1, such an electrical potential suitable for forming an inversion channel is an electrical potential that is positive with respect to source potential. The component is turned off if a voltage that reverse-biases the pn junction between the body zone 13 and the drift zone 12 is applied between the drain zone 11 and the source zone 14, and if an electrical potential suitable for forming an inversion channel is not present at the gate electrode 21. In the case of the n-channel MOSFET illustrated in FIG. 1, a voltage that turns the component off is a positive voltage between the drain zone 11 and the source zone 14 or the source electrode 15. When the component is turned off, a space charge zone propagates in the drift zone 12 proceeding from the pn junction between the body zone 13 and the drift zone 12. The dopant atoms present in the drift zone 12 are ionized in the region of the space charge zone. In the case of an n-doped drift zone 12, therefore, positively charged acceptor cores are present in the region of the space charge zone. An electric field running in a vertical direction of the semiconductor body 100 is associated with the formation of the space charge zone, the electric field resulting from the fact that for one portion of the positively charged acceptor cores present in the drift zone 12, countercharges in the form of negatively charged donor cores are present in the body zone 13. Another portion of the dopant charge present in the drift zone 12 is "compensated for" by the field electrode 22 in the off-state case, that is to say that this portion of the positively charged donor cores present in the drift zone 12 finds a corresponding negative countercharge on the field electrode 22, which is at a lower electrical potential than the drift zone 12 in the off-state case.

The maximum dielectric strength of the component is attained when an integral of the electric field strength of the vertical electric field proceeding from the pn junction between the body zone 12 and the drift zone 12 corresponds to the value of the breakdown voltage of the semiconductor material used, for example, silicon. The position in the drift zone 12 at which an avalanche breakdown occurs when the maximum dielectric strength is attained can be established by way of the mutual distance d1 between two trenches having field electrode sections 22 arranged therein. In this case, the location of the voltage breakdown shifts, proceeding from the pn junction between the body zone 13 and the drift zone 12, all the further downward, that is to say in a direction of the drain zone 11, the smaller the mutual distance d1 between two directly adjacent trenches. The location of the voltage breakdown therefore shifts all the further downward, the larger the proportion of the dopant charge within the mesa region—that is to say the region arranged between the trenches—which is compensated for by the field electrode 22 in the off-state case. The distance d1 between two adjacent trenches 20 is chosen, for example, such that in the case of a static voltage loading, an avalanche breakdown occurs in the drift zone 12 in the lower region of the trenches 20. In this case, "lower region" denotes that region of the trenches 20 which faces the drain zone 11. "Avalanche breakdown at low current density" hereinafter denotes an operating state in which the maximum dielectric strength of the component is attained by application of a high reverse voltage between the drain zone 11 or a drain connection D (illustrated schematically) and the source zone 14 or a source connection S, without the component being subjected, in drain-source direction, to a current loading with high current density such as, for example, in the case of an inductive load connected in series with the component. Such an avalanche breakdown with low current density is present, for example, when the current flowing through the component is less than 1 thousandth of the rated current of the component, that is to say of the current for which the component is permanently designed.

"Dynamic avalanche breakdown" or "avalanche breakdown at high current density" hereinafter denotes an avalanche breakdown of the component in which a current with high current density flows rapidly through the component after the maximum dielectric strength has been exceeded. This case is present, for example, when the current flowing through the component is in the region of the rated current or higher. This case occurs, for example, when the trench transistor serves for switching an inductive load (not illustrated) connected in series with the drain-source path and the maximum dielectric strength of the component is exceeded upon commutation of the load. The inductive load in this case rapidly provides for a high current flow of the trench transistor that is then operated at avalanche breakdown. In this case, the avalanche breakdown occurs firstly at the location set for the breakdown with low current density. However, the current flowing through the component can result in a dynamic alteration of the electrical potentials and of the electric field in the drift zone 12 in the mesa region, as will be explained below:

A high hole density in the drift zone 12, in one embodiment in the mesa region, is associated with a high current flowing through the drift zone after an avalanche breakdown. This increased hole density leads to an increase in the positive charge already present anyway on account of the ionized donor cores in the drift zone section between the trenches 20. Unless additional measures are taken, this brings about a "flipping over" of the electric field, such that the maximum of the electric field "migrates" in a direction of the pn junction between the body zone 13 and the drift zone 12 and the original maximum of the electric field in the lower region of the trenches is significantly attenuated.

Without the provision of additional measures, the dielectric strength of the component decreases during such a dynamic avalanche breakdown with the additional effect that the avalanche current is concentrated on the mesa region in which a further avalanche breakdown is established owing to the now shifted maximum of the electric field.

The effect explained above occurs particularly in components having a high dielectric strength, for example, having a dielectric strength of up to a few 100 V. In these components, the doping concentration of the drift zone 12 for achieving the required dielectric strength is so low that the avalanche current established has a significant effect on the charge distribution in the mesa region between the trenches 20. The doping concentration of the drift zone in the mesa region lies, for example, between $5 \cdot 10^{15}$ cm$^{-3}$ and $1 \cdot 10^{17}$ cm$^{-3}$, in one embodiment between $1 \cdot 10^{16}$ cm$^{-3}$ and $5 \cdot 10^{16}$ cm$^{-3}$.

In order to reduce the effect explained above of reduction of the dielectric strength during a dynamic avalanche breakdown, one exemplary embodiment of the component according to the invention provides a "safety zone" of the drift zone 12 between the trenches 20 and the drain zone 11, the dimension d2 of which in a vertical direction of the semiconductor body 100 is greater than or equal to the mutual distance d1 between two trenches 20. The dimensions of the safety zone, which is designated by the reference symbol 121 in FIG. 1, or the distance between the trenches 20 and the drain zone 11 can correspond in one embodiment to 1.5 times the mutual distance d1 between two trenches or more than 2 times the mutual distance d1 between two trenches. The following thus holds true: d2/d1≥1, d2/d1≥1.5 or d2/d1≥2. In this case, a doping concentration $N_{121}$ of the safety zone 121 is in the region of a doping concentration $N_{122}$ of the drift zone 12 in the mesa region, which is designated by the reference symbol 122 in FIG. 1. In this case, the doping concentration of the safety zone 121 deviates at most by 35%, in one embodiment at most by 20%, from the doping concentration of the mesa region 122, that is to say that the following holds true:

$$N_{121}=(1\pm0.35)\cdot N_{122} \quad (1a)$$

or $$N_{121}=(1\pm0.2)\cdot N_{122} \quad (1b).$$

During the production of the component, the mesa region 122 and the safety zone can initially have an identical doping concentration, for example, by providing an epitaxial layer having a homogeneous doping. A difference between the doping concentrations $N_{121}$, $N_{122}$ in the completed component arises, for example, owing to enhancement or depletion effects, for example, during the production of the trenches and the dielectrics 23, 24 arranged at the sidewalls of the trenches. In the extreme case, the doping concentration $N_{122}$ in the mesa region can be at most twice as high as the doping concentration in the safety zone. The following holds true in this case:

$$N_{122}=2\cdot N_{121} \quad (1c).$$

The safety zone 121 has the effect that in the event of a dynamic avalanche breakdown, a space charge zone of the drift zone 12 can propagate further in a direction of the drain zone 11, whereby the effect explained above of reduction of the dielectric strength is reduced. While in the static off-state case dopant atoms in the drift zone 12 are ionized as far as the level of the lower ends of the trenches 20 or are depleted by counter-charges in the body zone 13, on account of the safety zone 121 in the case of a dynamic breakdown dopant charges can also additionally be ionized or depleted in the safety zone 121. Overall, therefore, the charge depleted in the case of the dynamic breakdown is greater than the charge depleted in the case of a steady-state breakdown. To summarize, the safety zone 121 brings about an increase in the breakdown voltage compared with otherwise identical components without such a safety zone, prevents a negative-differential profile of the characteristic curve and thus leads overall to an improved breakdown strength of the component.

The dimensions and/or the doping concentration of the drift zone are chosen in such a way that when the component is turned off after the occurrence of a voltage breakdown, a depth over which an electric field extends in a direction of the second semiconductor zone 11 proceeding from a semiconductor junction between the drift zone 12 and the first semiconductor zone 13 is dependent on the current flowing through the component, wherein the depth in the case of a current corresponding to the rated current is 1.5 times as large as in the case of a current corresponding to at most a thousandth of the rated current.

Figure 2:
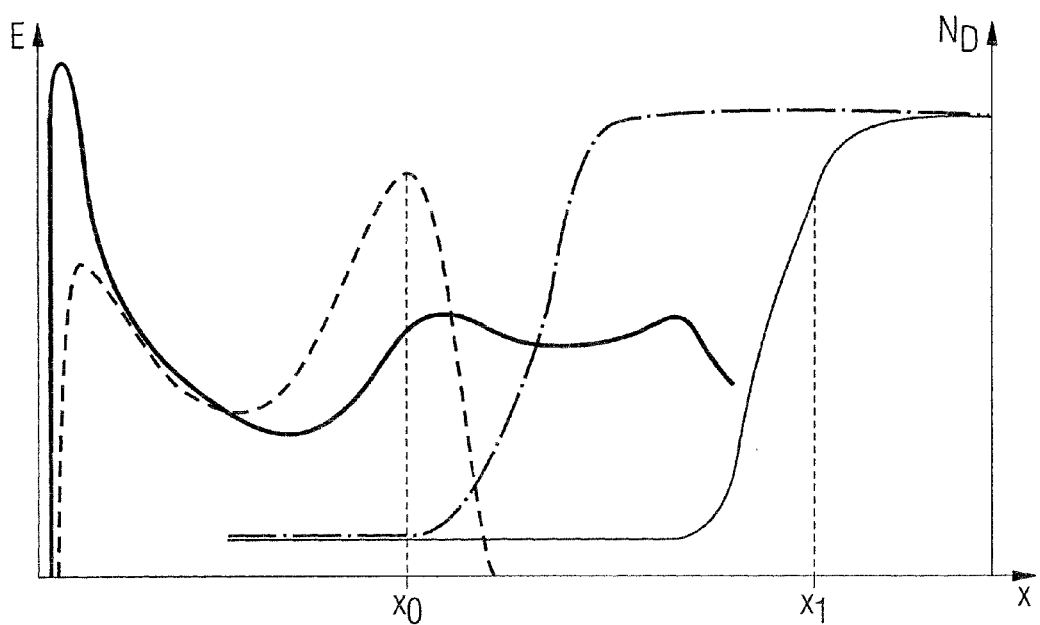
FIG. 2 illustrates one embodiment of a profile of the electric field in a drift zone of the transistor illustrated in FIG. 1 for a static and a dynamic avalanche breakdown.

The functioning explained above becomes clear on the basis of the profile of the electric field in the mesa region in a vertical direction x proceeding from the front side 101, as illustrated in FIG. 2. FIG. 2 illustrates the profile of the electric field for the case of a breakdown with low current density (illustrated in dashed fashion), and the case of a breakdown with high current density (illustrated in solid fashion). In the case of the breakdown with low current density, in which no additional current is impressed on the component apart from the current established as a result of the maximum dielectric strength being exceeded, a primary maximum of the electric field in a vertical direction of the semiconductor body 100 arises at a position $x_0$, which denotes the lower end of the trenches 20. In this case, the electric field does not propagate, or propagates only insignificantly, beyond the lower end of the trenches 20 in the drift zone 12. The doping profile for a conventional component is illustrated in dash-dotted fashion in FIG. 2.

In the case of a breakdown with high current density, in which an additional current is impressed on the component externally and can lead to potential shifts in the mesa region 122, a space charge zone can propagate beyond the lower end of the trenches 20 in the drift zone 12 on account of the safety zone 121. Although a maximum of the electric field here lies in the region of the pn junction between the body zone 13 and drift zone 12, this maximum is smaller than in the case of a component in which such a safety zone is not present, that is to say in which the trenches extend approximately as far as the drain zone 11. The profile of the doping concentration $N_D$ in the drift zone as a function of the distance x from the front side is additionally plotted as a solid line in FIG. 2. The dash-dotted line illustrates the doping profile for a conventional component in which a safety zone is not present.

A further embodiment of the component according to the invention provides for arranging the trenches 20 at a distance from the drain zone 11, that is to say likewise providing a safety zone 121 between the trenches 20 and the drain zone 11, but coordinating this distance d2 and the doping concentrations of the safety zone 121 with one another in such a way that an integral of the doping concentration in the safety zone 121, as viewed over the entire distance d2, is greater than or equal to 1.5 times the breakdown charge of the semiconductor material of the drift zone. The breakdown charge is between $2 \cdot 10^{12}$ cm$^{-2}$ and $3 \cdot 10^{12}$ cm$^{-2}$ for silicon and is in turn dependent on the doping concentration. The following therefore applies:

$$\int_{x_0}^{x_1} N_D dx \geq 1.5 \cdot Q_{BR}(N_D). \tag{2}$$

In this case, $X_0$ denotes the position of the lower end of the trenches 20, that is to say the beginning of the safety zone, $x_1$ denotes the position of the junction between the drift zone 12 and the drain zone 11, that is to say the end of the safety zone 121, $N_D$ denotes the doping concentration in the safety zone 121, and $Q_{BR}$ denotes the breakdown charge of the semiconductor material used for the drift zone. As is known, the breakdown charge $Q_{BR}$ is a function of the doping concentration, which will be explained briefly below: an avalanche breakdown occurs in a semiconductor material when the electric field strength of an electric field propagating in the semiconductor material exceeds a critical field strength value $E_c$, which is dependent on the doping concentration $N_D$ and for which (in the case of silicon as semiconductor material) the following applies:

$$E_c = 4010 \cdot N_D^{1/8} [V/cm] \tag{3}.$$

Taking account of this critical field strength value, depending on the doping concentration $N_D$ it is possible to determine the breakdown charge $Q_{BR}$, that is to say the dopant charge which has to be ionized for a given doping concentration in an electric field in order that an avalanche breakdown commences. In the case of silicon, the following holds true for this breakdown charge $Q_{BR}$ depending on the doping concentration $N_D$:

$$Q_{BR}(N_D) = 2.67 \cdot 10^{10} \cdot N_D^{1/8} [cm^{-2}] \tag{4}.$$

The integral of the doping concentration of the safety zone 121 as viewed over the entire distance d2 can be, in one embodiment, greater than 2 times the breakdown charge $Q_{BR}$ or 2.5 times the breakdown charge $Q_{BR}$.

Complying with the conditions specified under equation (1), the distance d2 between the trenches 20 and the drain zone 11 can also be smaller than the mutual distance d1 between two trenches. In this case, the doping concentration $N_D$ in the safety zone 121 can be greater than, less than or equal to the doping concentration in the mesa region 122. The doping concentration in the safety zone 121 can be in one embodiment between 0.01 times and 3 times the doping concentration in the mesa region 122.

Figure 3:
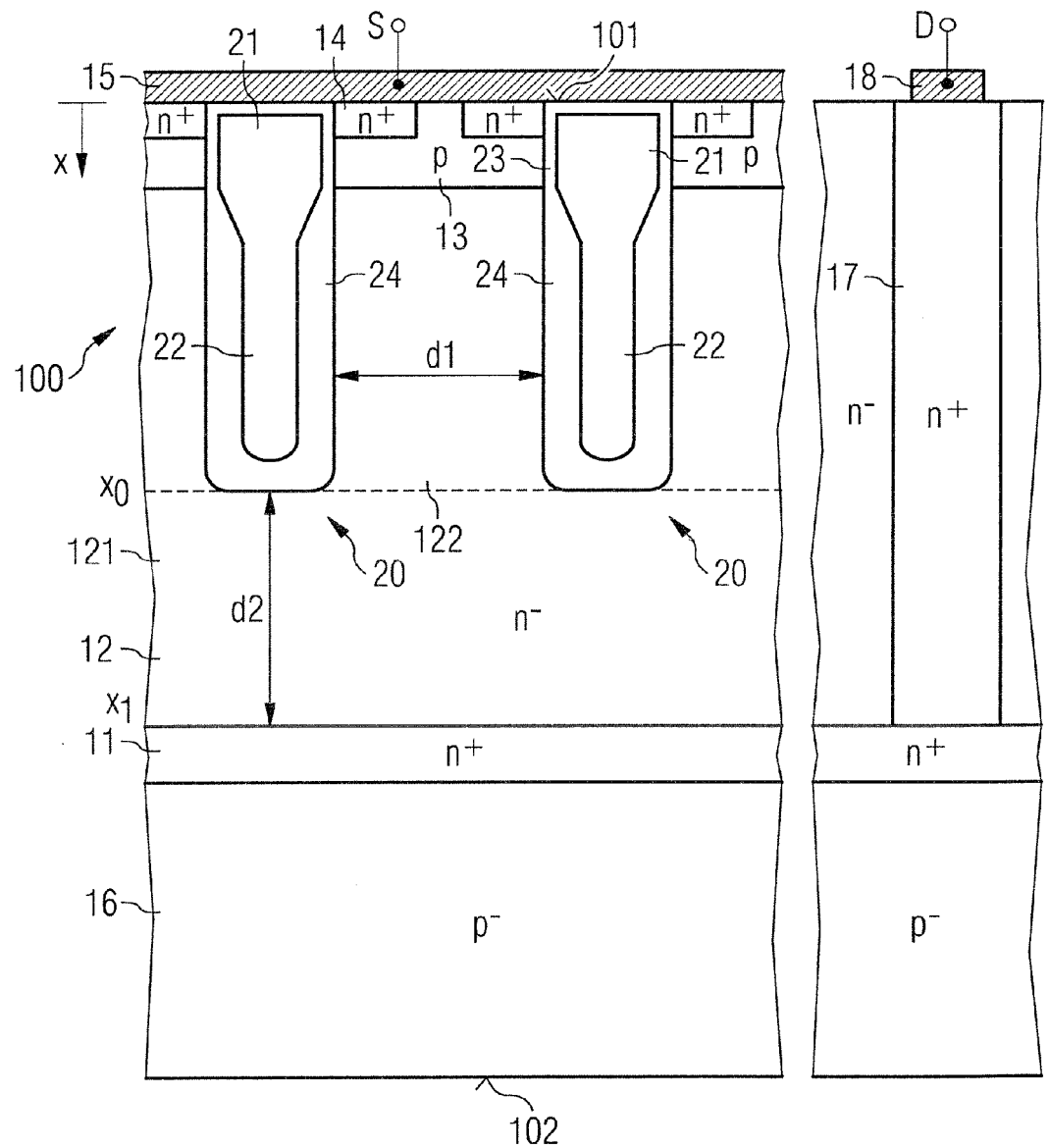
FIG. 3 illustrates one embodiment of a semiconductor component that is realized as a drain-up transistor.

The concept explained above of a component including a drift zone having a safety zone is not restricted to trench transistors having a drain zone on the rear side, but rather, referring to FIG. 3, is, for example, also applicable to drain-up transistors. In such a component, the drain zone 11 is arranged as a buried semiconductor zone between the drift zone 12 and a semiconductor layer doped complementarily to the drain zone, for example, a lightly doped semiconductor substrate. In this component, a drain electrode is arranged at the front side 101 of the semiconductor body 100 and connected to the drain zone 11 via a highly doped connecting zone 17 of the same conduction type as the drain zone 11. In this case, the connecting zone 17 can be arranged at a distance from the cell array having the transistor cells, which is illustrated schematically in FIG. 3.

Figure 4:
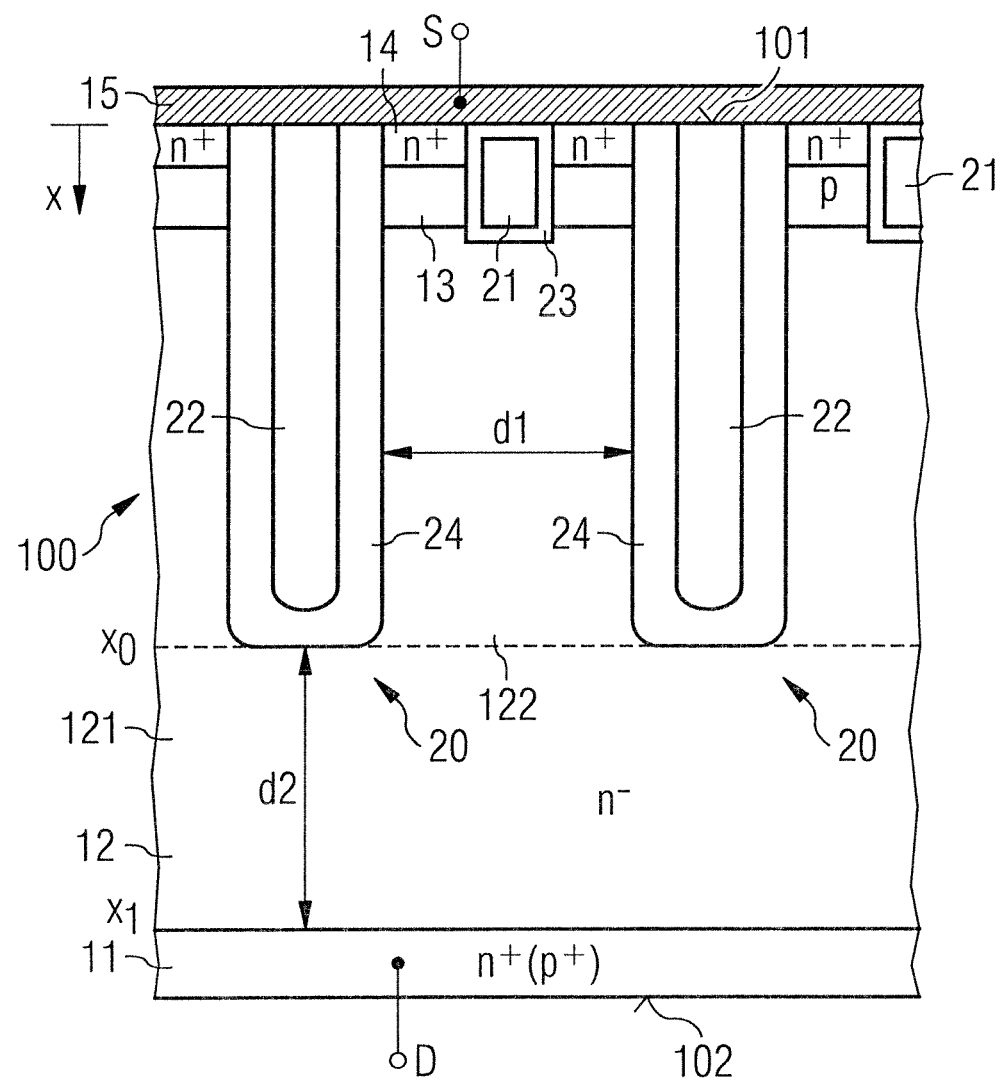
FIG. 4 illustrates one embodiment of a component that is formed as a trench transistor.

FIG. 4 illustrates a component which is modified by comparison with the component in accordance with FIG. 1 and in which the individual gate electrode sections 21 and the individual field electrode sections 22 are not arranged in common trenches but rather in separate trenches which are arranged at a distance from one another in a lateral direction of the semiconductor body. In this case, the trenches having the field electrode sections 22 can extend deeper into the semiconductor body in a vertical direction than the trenches having the gate electrode sections 21.

Figure 5:
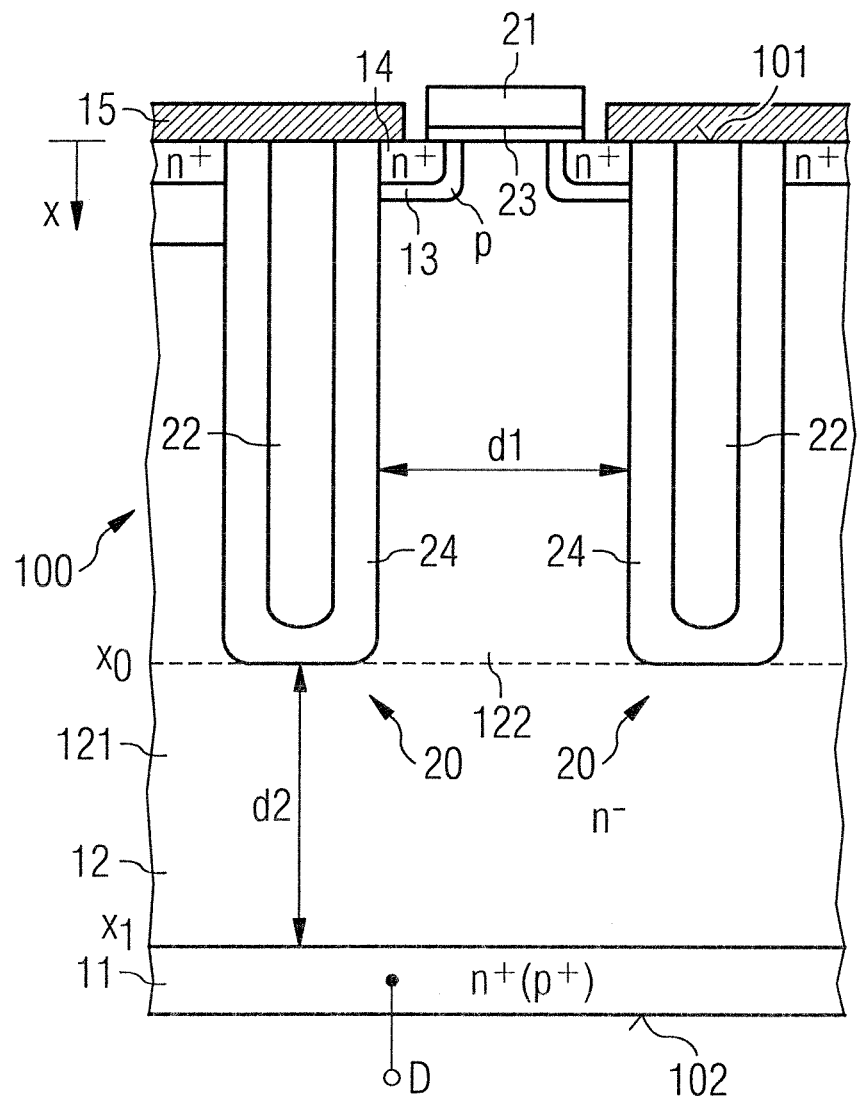
FIG. 5 illustrates one embodiment of a transistor having a planar gate electrode.

Moreover, the invention can also be used in connection with planar transistor structures. FIG. 5 illustrates a transistor having such a planar structure, that is to say having a gate electrode 21 arranged above the front side 101 of the semiconductor body. In this component, the drift zone 12 reaches below the gate electrode 21 as far as the front side 101 of the semiconductor body. In the on state, in this component an inversion channel forms in the body zone 13 in a lateral direction along the front side 101 of the semiconductor body.

Figure 6:
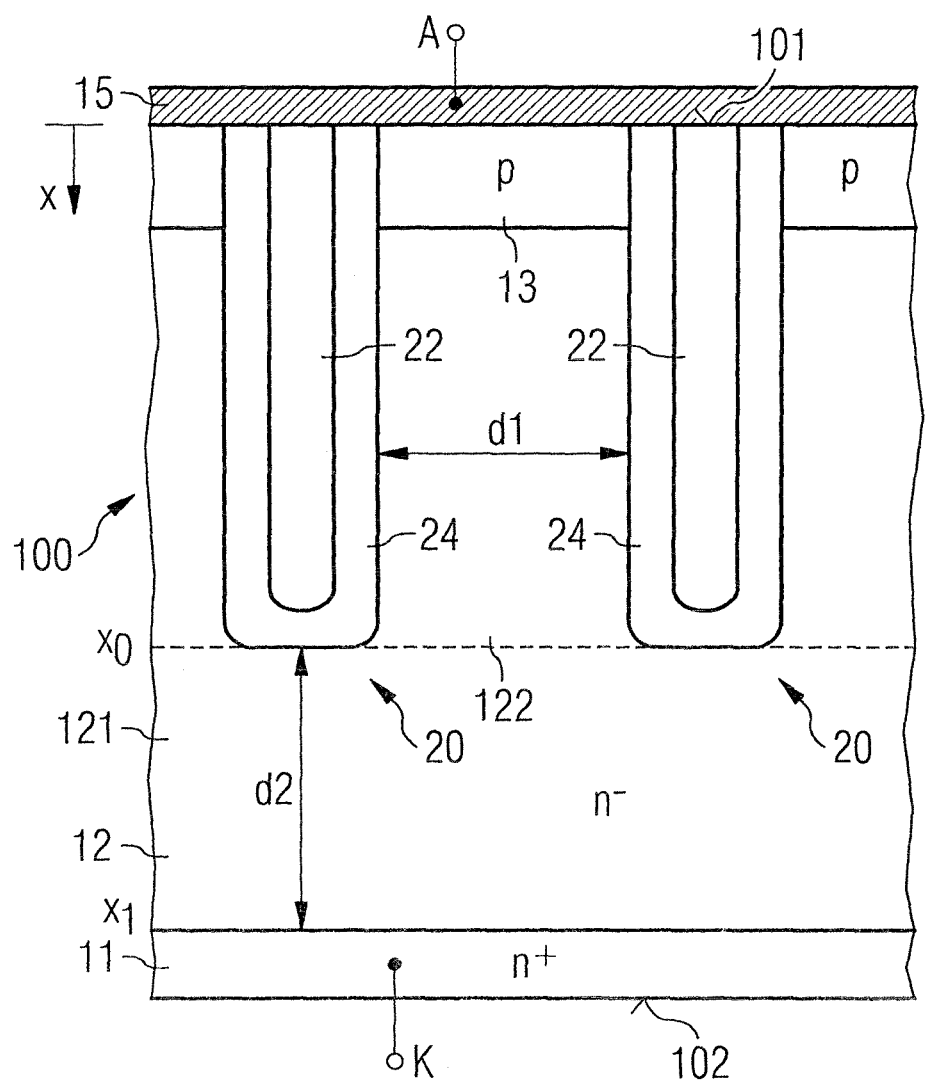
FIG. 6 illustrates one embodiment of a semiconductor component that is formed as a power diode.

Referring to FIG. 6, the concept explained above can also be applied to a vertical power diode. Such a power diode differs from the above-explained MOSFET structurally essentially by virtue of the fact that no source zone and no gate electrode are present. In this case, a semiconductor zone 13 that is adjacent to the drift zone 12 and doped complementary to the drift zone 12 forms an anode zone or first emitter zone, with which contact is made by an anode electrode 15. In this component, a cathode zone 11 is adjacent to that side of the drift zone that is remote from the first emitter zone 15, the cathode zone being of the same conduction type as the drift zone 12, but doped more highly, and contact being made with the cathode zone by a cathode electrode. The functioning of the diode illustrated in FIG. 6 differs from the function of the above-explained transistors in the on state, but has the same behavior in the off-state case, such that in this respect reference is made to the explanations concerning the component in accordance with FIG. 1.

The diode that is illustrated in FIG. 6 and has an n-doped drift zone is turned on when a negative voltage is applied between anode A and cathode K, and is turned off when a positive voltage is applied between anode and cathode. In this case, a space charge zone propagates proceeding from the pn junction between the first emitter zone 13 and the drift zone 12. At least one portion of the dopant charge arranged in the mesa region 122 is in this case compensated for by the field electrode sections 22, which are at anode potential in the example illustrated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor component comprising:
a semiconductor body;
a drift zone, a body zone, a source zone and a drain zone in the semiconductor body, wherein, in a vertical direction of the semiconductor body, the body zone is arranged between the source zone and the drift zone and the drift zone is arranged between the body zone and the drain zone;
a gate electrode dielectrically insulated from the body zone by a gate dielectric layer;

at least two trenches extending from a first side of the semiconductor body in the vertical direction into the semiconductor body, wherein the at least two trenches are arranged at a distance from one another in a lateral direction of the semiconductor body;

a field electrode arranged adjacent to the drift zone in the at least two trenches, wherein the field electrode is connected to the source zone; and a field dielectric layer dielectrically insulating the field electrode from the drift zone and being thicker than the gate dielectric layer, wherein the at least two trenches are arranged at a distance from the drain zone in the vertical direction;

wherein the distance between the trenches and the drain zone in the vertical direction is greater than 1.5 times the distance between the at least two trenches in the lateral direction, wherein a doping concentration of a drift zone section arranged in the vertical direction between the at least two trenches and the drain zone differs by at most 35% from a minimum doping concentration of a drift zone section arranged in the lateral direction between the trenches.

2. The semiconductor component of claim 1, wherein the doping concentration of the drift zone section arranged in the lateral direction between the trenches is between $5 \cdot 10^{15}$ cm$^{-3}$ and $1 \cdot 10^{17}$ cm$^{-3}$.

3. The semiconductor component of claim 1,
wherein the vertical direction is substantially perpendicular to the first side, and
wherein the lateral direction is substantially parallel to the first side.

4. The semiconductor component of claim 1,
wherein a conduction type of the body zone is complementary to a conduction type of the source zone and the drift zone.

5. The semiconductor component of claim 4,
wherein a conduction type of the drain zone equals a conduction type of the drift zone.

6. The semiconductor component of claim 4,
wherein a conduction type of the drain zone is complementary to a conduction type of the drift zone.

7. The semiconductor component of claim 1, wherein the doping concentration of the drift zone section arranged in the vertical direction between the trenches and the drain zone differs by at most 20% from the minimum doping concentration of the drift zone section arranged in the lateral direction between the trenches.

8. The semiconductor component of claim 1, wherein the gate electrode and the field electrode are arranged in the at least two trenches.

9. The semiconductor component of claim 1,
wherein the drain zone is arranged between the drift zone and a semiconductor layer doped complementarily to the drain zone, and
wherein the semiconductor component further comprises a connecting zone of the same conduction type as the drain zone, wherein the connecting zone extends from the first side to the drain zone.

10. The semiconductor component of claim 1, wherein the dimensions and/or the doping concentration of the drift zone are chosen in such a way that when the component is turned off after the occurrence of a voltage breakdown, a depth over which an electric field extends in a direction of the second semiconductor zone proceeding from a semiconductor junction between the drift zone and the body zone is dependent on the current flowing through the component, wherein the depth in the case of a current corresponding to a rated current is 1.5 times as large as in the case of a current corresponding to at most a thousandth of the rated current.

11. A method, comprising:
forming a drift zone, a body, a source zone and a drain zone in the semiconductor body, such that, in a vertical direction of the semiconductor body, the body zone is arranged between the source zone and the drift zone and the drift zone is arranged between the body zone and the drain zone;

forming a gate electrode dielectrically insulated from the body zone by a gate dielectric layer;

forming at least two trenches extending from a first side of the semiconductor body in a vertical direction into the semiconductor body, wherein the at least two trenches are arranged at a distance from one another in a lateral direction of the semiconductor body;

forming a field electrode in the at least two trenches adjacent to the drift zone, the field electrode connected to the source zone;

forming a field dielectric layer dielectrically insulating the field electrode from the drift zone and being thicker than the gate dielectric layer;

wherein forming the at least two trenches comprises forming the at least two trenches at a distance from the drain zone in the vertical direction such that a distance between the at least two trenches and the drain zone in the vertical direction is greater than 1.5 times a distance between the at least two trenches in the lateral direction; and wherein forming the drift zone comprises providing a doping concentration of a drift zone section arranged in the vertical direction between the trenches and the drain zone such that it differs by at most 35% from a minimum doping concentration of a drift zone section arranged in the lateral direction between the trenches.

12. The method of claim 11, wherein the doping concentration of the drift zone section arranged in the lateral direction between the trenches is between $5 \cdot 10^{15}$ cm$^{-3}$ and $1 \cdot 10^{17}$ cm$^{-3}$.

13. The method of claim 12,
wherein forming the drain zone comprises forming the drain zone such that a conduction type of the drain zone is complementary to a conduction type of the drift zone.

14. The method of claim 11,
wherein the vertical direction is substantially perpendicular to the first side, and
wherein the lateral direction is substantially parallel to the first side.

15. The method of claim 11,
wherein forming the drift zone, the body zone and the source zone comprises forming the drift zone, the body zone and the source zone such that a conduction type of the body zone is complementary to a conduction type of the source zone and the drift zone.

16. The method of claim 15,
wherein forming the drain zone comprises forming the drain zone such that a conduction type of the drain zone equals a conduction type of the drift zone.

17. The method of claim 11, wherein forming the drift zone comprises providing the doping concentration of the drift zone section arranged in the vertical direction between the at least two trenches and the drain zone such that it differs by at most 20% from the minimum doping concentration of the drift zone section arranged in the lateral direction between the trenches.

18. The method of claim 11, wherein a distance between the trenches and the second semiconductor zone and a doping concentration of the drift zone in the section between the trenches and the second semiconductor zone are coordinated with one another in such a way that an integral of the doping concentration of the drift zone in a vertical direction of the semiconductor body between the trenches and the second semiconductor zone is greater than or equal to 1.5 times the breakdown charge of the semiconductor material of the drift zone.

19. The method of claim 18, wherein the integral of the dopant charge of the drift zone in the vertical direction is greater than or equal to 2 times the breakdown charge of the semiconductor material of the drift zone.

20. The method of claim 19, wherein the integral of the dopant charge of the drift zone in the vertical direction is greater than or equal to 2.5 times the breakdown charge of the semiconductor material of the drift zone.

* * * * *